(12) United States Patent
Kotani et al.

(10) Patent No.: US 8,101,516 B2
(45) Date of Patent: Jan. 24, 2012

(54) METHOD OF FORMING CONTACT HOLE PATTERN IN SEMICONDUCTOR INTEGRATED CIRCUIT DEVICE

(75) Inventors: Toshiya Kotani, Machida (JP); Hiroko Nakamura, Yokohama (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1146 days.

(21) Appl. No.: 11/857,275

(22) Filed: Sep. 18, 2007

(65) Prior Publication Data
US 2008/0070402 A1 Mar. 20, 2008

(30) Foreign Application Priority Data
Sep. 20, 2006 (JP) .................. 2006-254709

(51) Int. Cl.
*H01L 21/4763* (2006.01)
(52) U.S. Cl. .............. 438/622; 438/629; 438/637
(58) Field of Classification Search .......... 438/622, 438/629, 637
See application file for complete search history.

(56) References Cited

U.S. PATENT DOCUMENTS

| | | | |
|---|---|---|---|
| 6,812,572 B2 | 11/2004 | Yang et al. | |
| 7,176,066 B2 * | 2/2007 | Brenner et al. | 438/142 |
| 7,329,953 B2 * | 2/2008 | Tu | 257/758 |
| 2004/0029385 A1 * | 2/2004 | Manger et al. | 438/689 |
| 2006/0079080 A1 * | 4/2006 | Tsai et al. | 438/618 |
| 2006/0128140 A1 * | 6/2006 | Kim | 438/637 |
| 2006/0186439 A1 * | 8/2006 | Tanaka | 257/233 |

FOREIGN PATENT DOCUMENTS

| | | |
|---|---|---|
| JP | 8-279488 | 10/1996 |
| JP | 2006-173186 | 6/2006 |

OTHER PUBLICATIONS

Notification of Reasons for Rejection issued by the Japanese Patent Office in counterpart Application No. 2006-254709, mailed Nov. 25, 2008.

* cited by examiner

*Primary Examiner* — James Mitchell
(74) *Attorney, Agent, or Firm* — Finnegan, Henderson, Farabow, Garrett & Dunner, L.L.P.

(57) ABSTRACT

A block film is formed on a region which includes a region of an insulating layer where a first hole is to be formed, and in which no second hole is to be formed, and a resist film having openings for forming the first and second holes is formed on the block film and insulating layer. Etching is performed by using the resist film as a mask, thereby forming the first hole in the block film and insulating layer, and the second hole in the insulating layer. The depth of the first hole from the upper surface of the insulating layer is smaller than that of the second hole, so the first hole does not reach the semiconductor substrate.

9 Claims, 8 Drawing Sheets

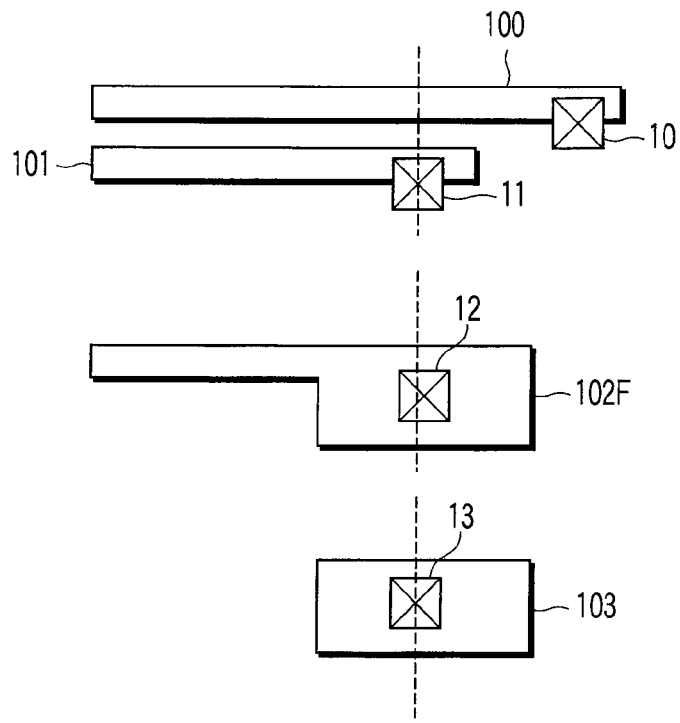
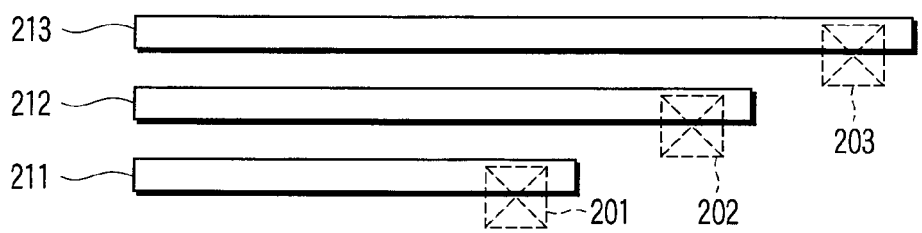
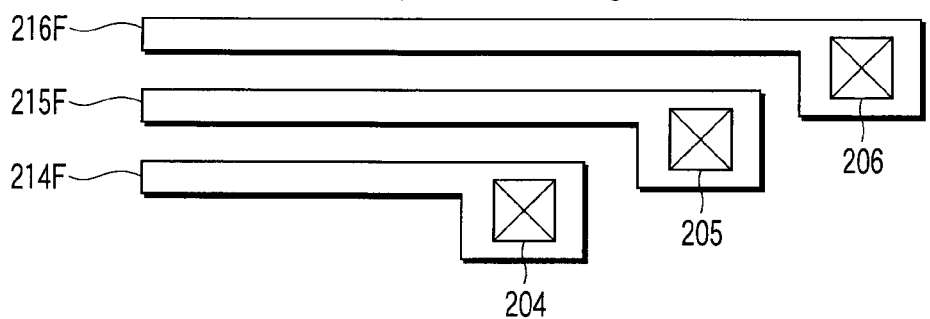
FIG. 2

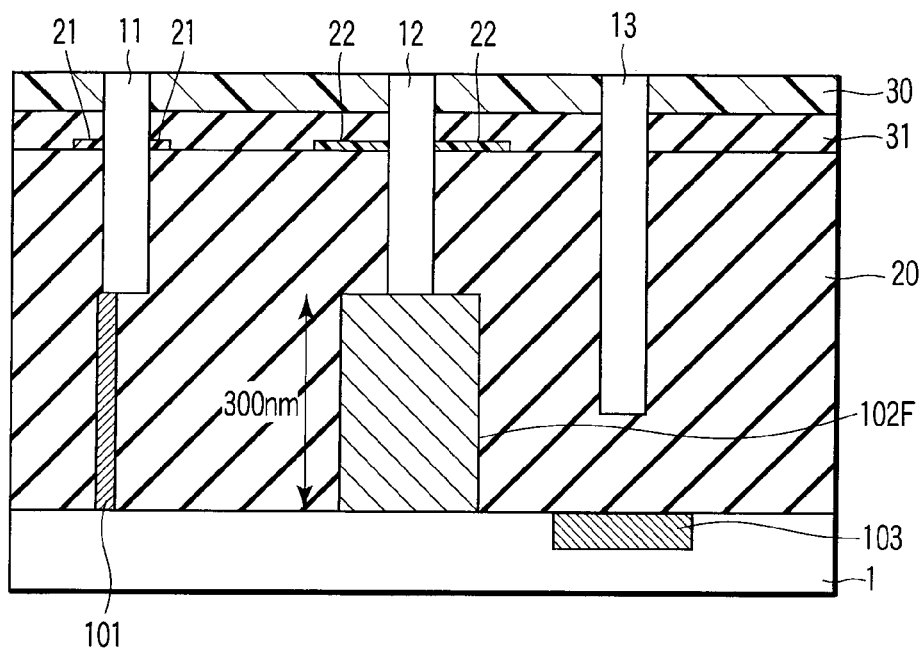
F I G. 7
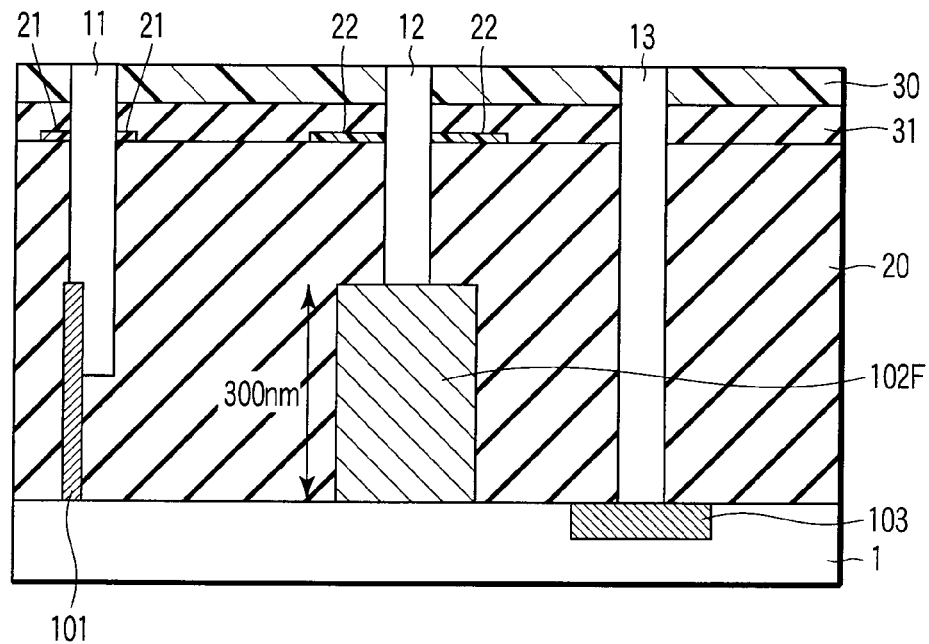
F I G. 8

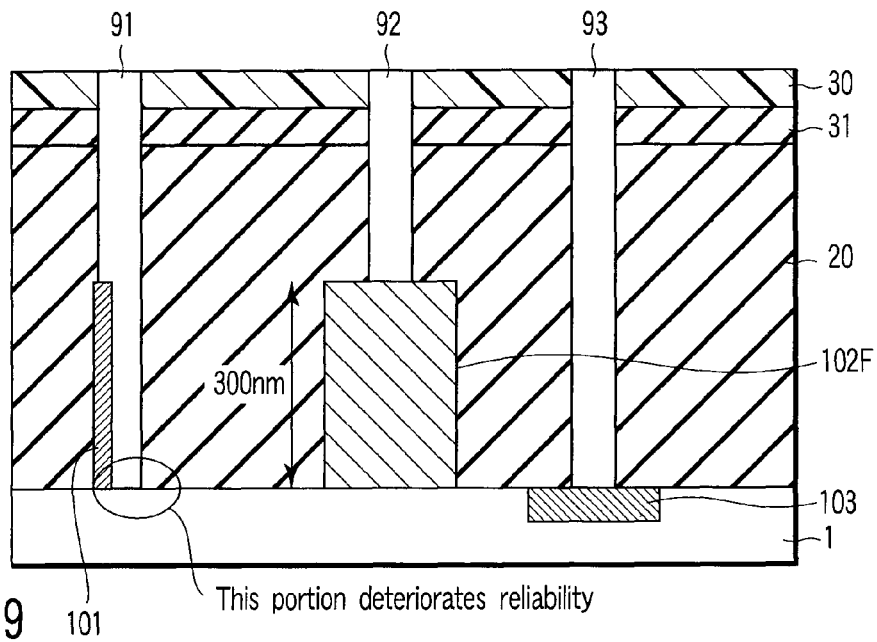
F I G. 9
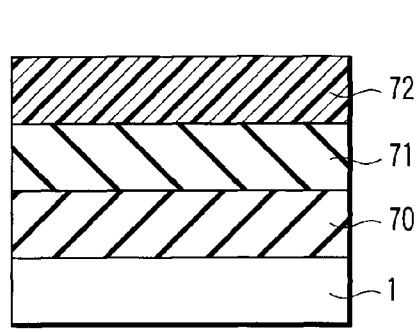
F I G. 10
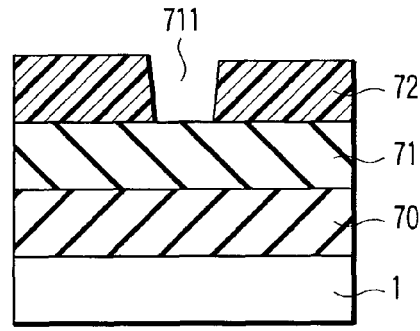
F I G. 11
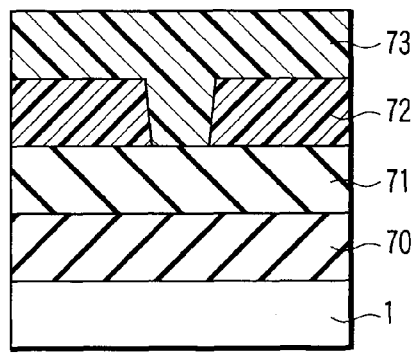
F I G. 12

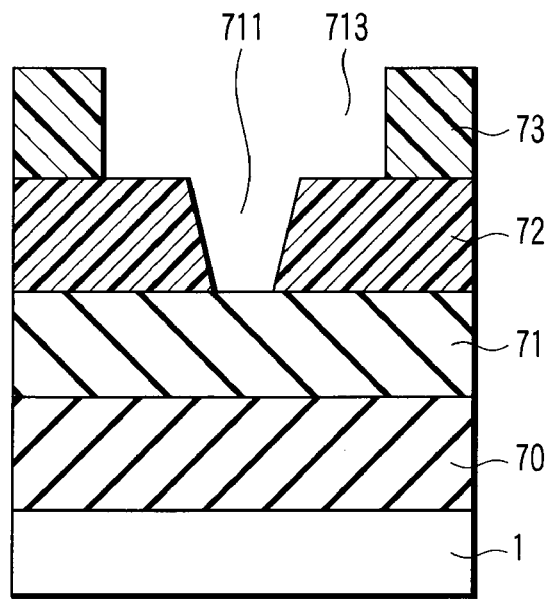
F I G. 13
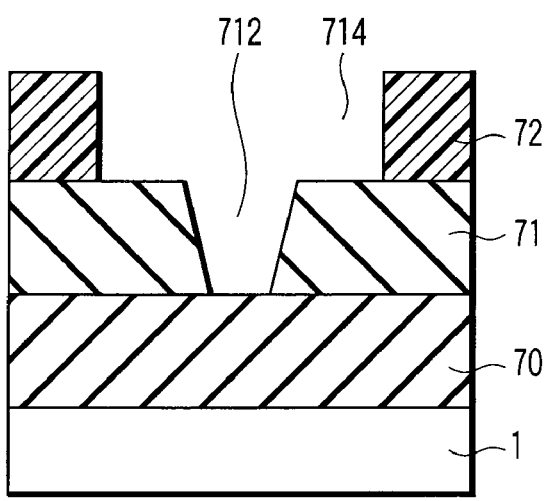
F I G. 14

METHOD OF FORMING CONTACT HOLE PATTERN IN SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-254709, filed Sep. 20, 2006, the entire contents of which are incorporated herein by reference.

BACKGROUND OF THE INVENTION

1. Field of the Invention

The present invention relates to a method of forming a contact hole pattern in a semiconductor integrated circuit device.

2. Description of the Related Art

The progress of the recent semiconductor fabrication techniques is very remarkable, and semiconductors having a minimum processing dimension of 90 nm are presently mass-produced. Micropatterning like this is achieved due to the rapid progress in the fine pattern formation techniques, such as the mask processing technique, lithography process technique, and etching process technique.

To further advance micropatterning in the processing of a flash memory and the like, a method that achieves micropatterning at low cost by adding another technique to the conventional lithography technique has been developed.

A via hole or contact hole (these holes will be collectively referred to as contact holes hereinafter) is necessary to obtain an electrical connection between interconnections or from an interconnection to a gate or diffusion layer. A connecting portion between the contact hole and a lower interconnection layer such as a gate interconnection requires a pattern wider than interconnections in portions other than the connecting portion.

The interconnection width in this connecting portion is determined by taking account of the misalignment between the masks of the contact hole and lower interconnection layer, and the final dimensional difference between the lower interconnection layer and contact hole. This portion having a large interconnection width in the connecting portion is called a fringe.

In a similar vain, as the micropatterning of interconnections and gate patterns advances, the formation of these patterns is beginning to require the techniques called resolution enhancement techniques. Examples of these resolution enhancement techniques are Alt.PSM (Alternating Phase Shift Mask) (Levenson mask), SRAF (Sub-resolution Assist Features), and OAI (Off-Axis Illumination).

When using these resolution enhancement techniques, it is necessary to customize the illumination shape of an exposure apparatus so as to resolve only fine patterns, and use a mask whose phase, transmittance, and the like are changed. This makes it possible to ensure a sufficient lithography margin for a simple line shape, but makes it difficult to resolve other patterns.

The fringe portion described above is a pattern other than a simple line pattern. Accordingly, it is very difficult to form a fine line pattern by the resolution enhancement techniques and form the fringe portion and its vicinity with a sufficient lithography margin at the same time.

That is, when the resolution enhancement techniques are used to resolve fine patterns, it becomes difficult to secure the fringes of interconnections and gates. This makes it difficult to assure the device reliability in the contact hole connecting portion (e.g., Jpn. Pat. Appln. KOKAI Publication No. 2006-173186).

BRIEF SUMMARY OF THE INVENTION

According to an aspect of the present invention, there is provided a pattern formation method of forming a first hole and a second hole having different depths in an insulating layer formed on a semiconductor substrate, the method comprising forming a block film on a region which includes a region of the insulating layer where the first hole is to be formed, and in which the second hole is not to be formed, forming a resist film having openings for forming the first hole and the second hole, on the block film and the insulating layer, and performing etching by using the resist film as a mask, thereby forming the first hole in the block film and the insulating layer, and the second hole in the insulating layer, a depth of the first hole from an upper surface of the insulating layer being smaller than that of the second hole such that the first hole does not reach the semiconductor substrate.

According to another aspect of the present invention, there is provided a semiconductor device fabrication method comprising sequentially stacking a silicon oxide film, a hard mask, and a first resist film on a semiconductor substrate, forming a first resist pattern corresponding to one of a contact hole and a via hole by exposing and developing the first resist film, forming a second resist film on the first resist film, exposing and developing an interconnection pattern, and forming a second resist pattern corresponding to the interconnection pattern to expose at least a portion of an opening of the first resist pattern, performing etching by using the first resist pattern and the second resist pattern as masks, thereby patterning the hard mask by the first resist pattern, and the first resist by the second resist pattern, advancing the etching to form one of a contact hole and a vial hole by patterning the oxide film by the patterned hard mask, and form an interconnection pattern by patterning the hard mask by the patterned first resist film, and burying an interconnection material in one of the contact hole and the via hole formed in the oxide film, and in the interconnection pattern formed in the hard mask.

BRIEF DESCRIPTION OF THE SEVERAL VIEWS OF THE DRAWING

FIG. 1 is a plan view showing the layout of contact holes formed by a pattern formation method according to the first embodiment of the present invention;

FIG. 2 is a plan view showing the patterns of gates having no fringes and the patterns of gates having fringes;

FIG. 7 is a sectional view showing a predetermined step following FIG. 6 of the contact hole pattern formation method;

FIG. 8 is a sectional view showing a predetermined step following FIG. 7 of the contact hole pattern formation method;

FIG. 9 is a sectional view showing a predetermined step of the conventional contact hole pattern formation method;

FIG. 10 is a sectional view showing a predetermined step of a pattern formation method according to the second embodiment of the present invention;

FIG. 11 is a sectional view showing a predetermined step following FIG. 10 of the pattern formation method;

FIG. 12 is a sectional view showing a predetermined step following FIG. 11 of the pattern formation method;

FIG. 13 is a sectional view showing a predetermined step following FIG. 12 of the pattern formation method;

FIG. 14 is a sectional view showing a predetermined step following FIG. 13 of the pattern formation method;

DETAILED DESCRIPTION OF THE INVENTION

First Embodiment

FIG. 1 is a plan view showing the layout of three types of contact holes; 11, 12, and 13, formed in an insulating layer formed on a semiconductor substrate, in order to explain a contact hole pattern formation method according to the first embodiment of the present invention.

That is, FIG. 1 is a plan view showing the positional relationship between a gate 101 having no fringe, a gate 102F having a fringe, and an impurity diffusion layer 103 formed on the semiconductor substrate and respectively connecting to the contact holes 11, 12, and 13. In the gate 102F having a fringe, as shown in FIG. 1, a portion of the pattern must be widened in the fringe. The impurity diffusion layer 103 is, e.g., the source or drain region of a transistor.

FIG. 2 shows details of the patterns of gates having no fringes and the patterns of gates having fringes when it is necessary to form fine gate patterns smaller than the diameter of a contact hole, such as the gate 101 having no fringe and the gate 102F having a fringe shown in FIG. 1. Gates 211, 212, and 213 having no fringes and gates 214F, 215F, and 216F having fringes are actually interconnections extended to connect the gates of transistors to contacts.

Figure 3:
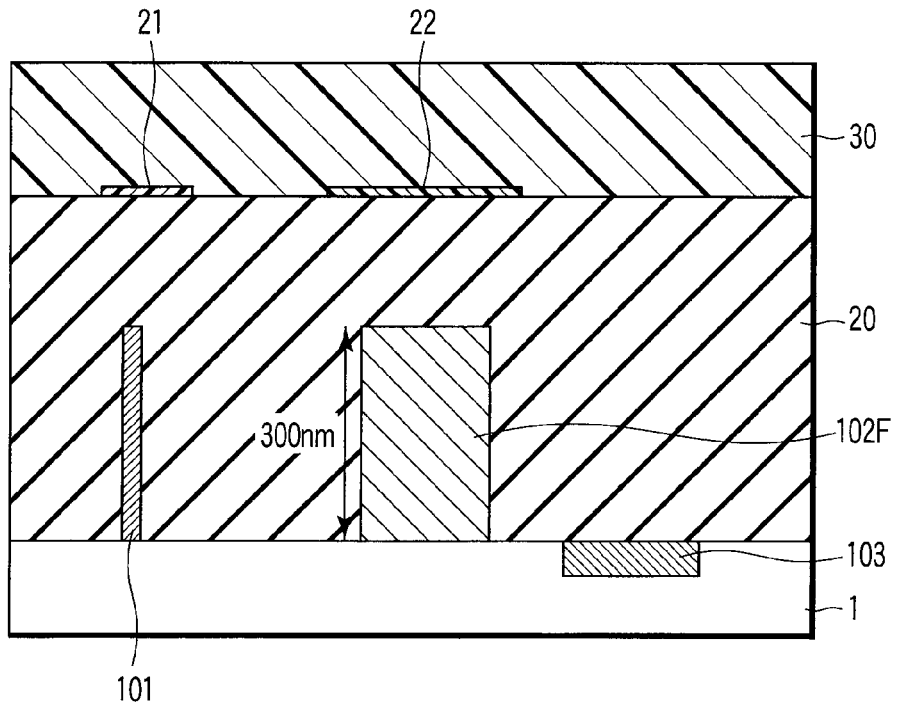
FIG. 3 is a sectional view taken along the dotted lines in FIG. 1, and showing a predetermined step of the contact hole pattern formation method according to the first embodiment.

As shown in FIG. 3 as a sectional view taken along the dotted lines in FIG. 1, an insulating layer 20 made of, e.g., $SiO_2$ covers the gate 101 having no fringe, the gate 102F having a fringe, and the diffusion layer 103 formed on a substrate 1. Note that FIG. 3 does not show a gate 100 having no fringe and the contact holes 11, 12, and 13 that have not been formed yet.

The pattern formation method according to this embodiment first selects only the contact hole 11 (a first contact hole) or both the contact holes 11 and 12 from the three types of contact holes shown in FIG. 1. In this embodiment, for example, both the contact holes 11 and 12 are selected.

First, resist patterns 21 and 22 are formed on the prospective regions of the contact holes 11 and 12 on the surface of the insulating layer 20. The resist patterns 21 and 22 function as block films that delay the progress of etching in a later etching process.

In this case, no critical mask is necessary because the thin resist films 21 and 22 need only exist on the upper surface of the insulating layer 20 in which the contact holes 11 and 12 are to be formed. Therefore, it is also possible to form patterns as shown in FIG. 3 by using a rough mask having loose mask standards and the like.

The contact holes can be selected by using the boolean operation for the insulating layer 20 and a resizing process. For example, the contact hole 12 can be selected by ANDing the gate regions 101 and 102F and the contact hole region. In this processing, the AND operation selects a contact hole completely included in the gate regions 101 and 102F. Therefore, the contact hole 11 is not selected, and the contact hole 12 is selected.

In addition, the contact hole 13 (a second contact hole) can be selected by ANDing the region of the diffusion layer 103 and the contact hole region.

The contact hole 11 can be selected by subtracting (a NOT operation) the control holes 12 and 13 from the three contact holes.

When forming block films on the insulating layer 20 by using a rough mask, regions obtained by resizing the prospective regions of the contact holes 11 and 12 by margins that completely cover these prospective regions when viewed from above are determined as block film formation regions.

After that, the formation regions of resist films (block films) can be determined by ORing the block film formation regions of the contact holes 11 and 12.

The example of the logic operation described above is explained by using the contact holes 11, 12, and 13 as representative examples of the three types of contact holes. In practice, however, a plurality of contact holes exist for each type, and the above logic operation is executed on these contact holes. In the following description, the contact holes 11, 12, and 13 will be explained as representative examples of contact holes for contacts connecting to a gate having no fringe, a gate having a fringe, and an impurity diffusion layer.

FIG. 3 shows an example of the case that the resist patterns 21 and 22 (block films) are respectively formed for the contact holes 11 and 12. However, it is also possible to form only the resist pattern 21 for the contact hole 11.

The resist film thickness of the resist patterns 21 and 22 can be obtained by calculating the etching selectivity on the basis of a base material forming the insulating layer 20 to be processed to form the contact holes 11 and 12 and the depth of the base material.

For example, assuming that the insulating layer 20 is to be etched to a depth of 500 nm, the resist film thickness (block film thickness) is about 100 nm (=500×⅕) if the selectivity of the base material forming the insulating layer 20 and the resist is 5:1. Note that this embodiment uses resist films as the block films, but a film made of another material which has an etching rate lower than that of the insulating layer may also be used as long as the necessary selectivity is obtained. The block films may be made of films of the same material as the insulating layer 20 or a material having a high etching rate. If the block films use a material having a higher etching rate than that of the insulating layer 20, they can be thin. Accordingly, the resist films and antireflection coatings formed on the block films can be flattened, and the lithography process can be executed with high precision.

It is also possible to form an antireflection coating (ARC) on the insulating layer 20 before the formation of the resists 21 and 22, and then form the resists 21 and 22 on this antireflection coating.

After that, as shown in FIG. 3, another resist 30 is formed by coating so as to cover the upper surfaces of the resists 21 and 22 and the prospective region of the contact hole 13 on the upper surface of the insulating layer 20. Before the resist 30 is formed by coating, therefore, the resists 21 and 22 may also be made insoluble to the developer of the resist 30.

The process of insolubilizing the resist is performed by curing the resist made of an organic film or the like by irradiating it with light or the like. When coating the resist with the antireflection coating as will be described later, the resist insolubilizing process can be executed before that.

Figure 4:
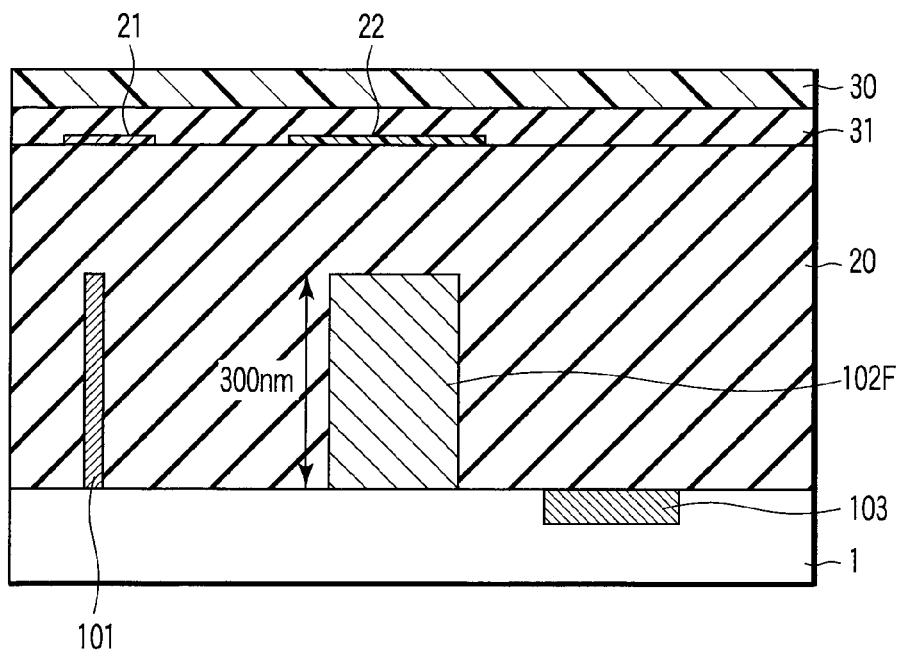
FIG. 4 is a sectional view showing a predetermined step of the contact hole pattern formation method according to the first embodiment.

FIG. 4 shows an example in which after the resists 21 and 22 are formed as shown in FIG. 3, the resists 21 and 22 and a region including the prospective region of the contact hole 13 are coated with an antireflection coating (ARC) 31, and the antireflection coating 31 is coated with the resist 30. The resist 30 may also be made of a material different from that of the resists 21 and 22 as block films.

The antireflection coating 31 is not always necessary when forming a contact hole having a large diameter in the resist 30, but is essential to prevent the reflection of exposure light from below when forming a critical mask to form a contact hole having a small diameter.

Figure 5:
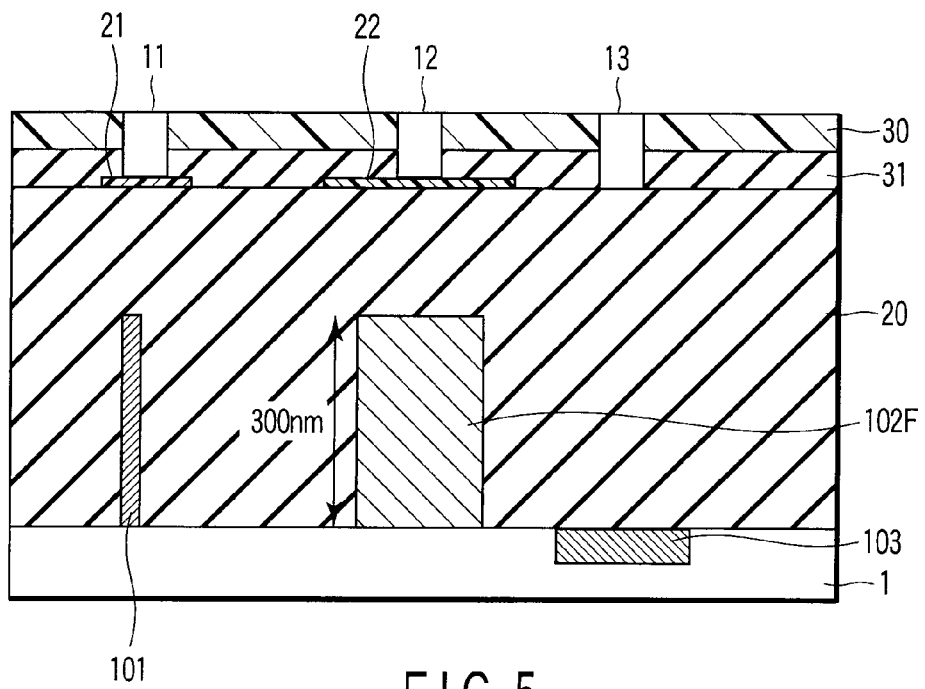
FIG. 5 is a sectional view showing a predetermined step following FIG. 4 of the contact hole pattern formation method.

FIG. 5 is a sectional view showing a structure after the contact holes 11, 12, and 13 are formed by exposure and development in the resist 30 formed in FIG. 4, and the antireflection coating 31 is processed by using the resist 30 as a mask.

As shown in FIG. 5, the processing speed of the contact holes 11 and 12 formed in the regions where the thin resist films (block films) 21 and 22 exist largely reduces in these regions. Since, however, the etching rate of the antireflection coating 31 is higher than that of the resist films 21 and 22, the contact hole 13 formed in the region where no resist films 21 and 22 exist extends through the antireflection coating 31.

Figure 6:
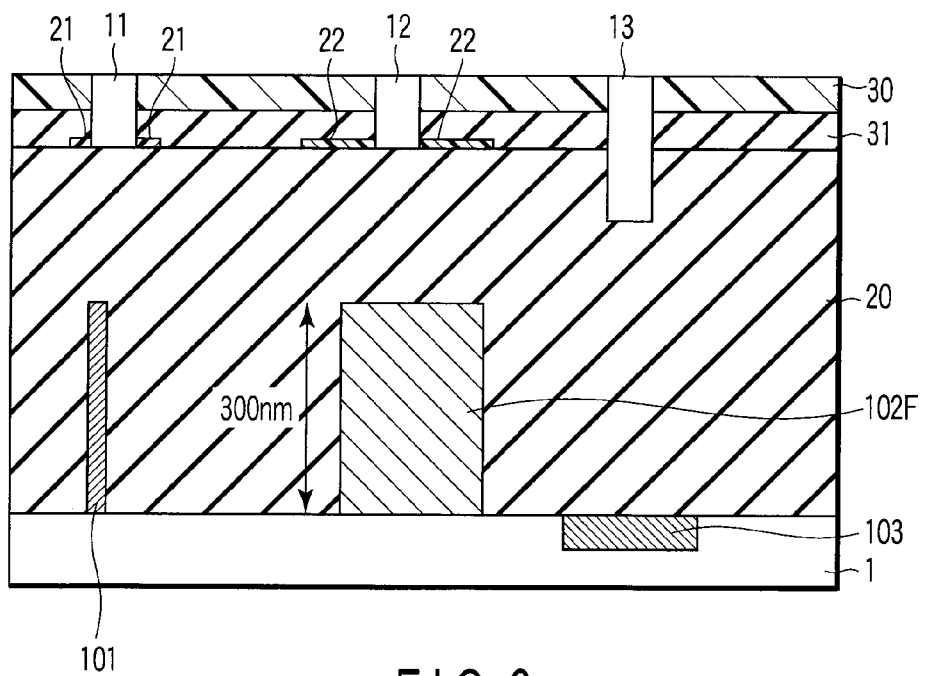
FIG. 6 is a sectional view showing a predetermined step following FIG. 5 of the contact hole pattern formation method.

As shown in FIG. 6, in an etching process subsequently performed on the insulating layer 20 after that, the selectivity between the resist films 21 and 22 and the insulating layer 20 makes the etching speed of the contact holes 11 and 12 different from that of the contact hole 13. Accordingly, processing of the contact hole 13 having no resist films 21 and 22 progresses, whereas processing of the contact holes 11 and 12 having the resist films 21 and 22 does not easily progress.

FIG. 7 shows the state in which the etching of the contact holes 11 and 12 has reached the gates 101 and 102F. Generally, the height of the gates 101 and 102F perpendicular to the surface of the substrate 1 is larger than that of the diffusion layer 103, so the contact hole 13 has not reached the diffusion layer 103 yet when the contact holes 11 and 12 have reached the gates 101 and 102F. Therefore, the processing further continues.

When the etching further advances, the contact hole 13 reaches the diffusion layer 103 as shown in FIG. 8, and the processing is terminated. In this state, since the existence of the resist films 21 and 22 decreases the etching speed of the contact hole 11, the contact hole 11 has not reached the substrate 1 when the processing is complete.

In the conventional method using no resist films 21 and 22, as shown in FIG. 9, when a contact hole 93 has reached the diffusion layer 103, a contact hole 91 may have reached the substrate because the gate 101 has no sufficient fringe. In this case, current leakage from the contact 91 to the substrate 1 deteriorates the reliability of the device. To prevent the deterioration of the device reliability, therefore, the gate fringe 102F must be formed to avoid a direct contact of the contact hole 91 with the substrate 1.

In this embodiment, however, as shown in FIG. 8, the etching step can be terminated in the state in which the contact hole 11 is not in contact with the substrate 11, so insulation between a metal interconnection (not shown) in the upper layer of the contact and the substrate can be held without any gate fringe. This prevents the deterioration of the device reliability.

As described above, a resist material having a predetermined thickness is formed by coating, the resists 21 and 22 are partially formed by exposure and development, and a region including the resists 21 and 22 is further coated with a resist, thereby forming and processing a resist pattern in which the resist film thickness partially changes. This technique is called a bilayer resist process.

When the pattern formation method of this embodiment using the bilayer resist process is used, it is possible to selectively control the processing speeds of contact holes, i.e., the depths of the contact holes when the processing is complete, by forming two resists for forming a hole pattern and to be used as a block film. This makes it possible to prevent electrical conduction from an interconnection to the substrate. Accordingly, a highly reliable semiconductor integrated circuit can be fabricated.

At the same time, pattern shapes can be simplified because no gate fringes are necessary, so micropatterning of gate patterns can be achieved by using a stricter resolution advanced technique. In short, the pattern formation method of this embodiment can form fine patterns at a low cost without deteriorating the reliability of the device.

An outline of a semiconductor device fabrication method using the pattern formation method according to the first embodiment will be explained below by taking the fabrication steps of a memory cell portion in a NAND flash memory as an example.

First, a stacked gate structure including a floating gate and control gate is formed by the well-known fabrication steps. That is, a tunnel oxide film, first polysilicon layer, insulating film (called an interpoly insulating film), and second polysilicon layer are sequentially stacked on the major surface of a semiconductor substrate, and patterned by the mask process technique, lithography process technique, and etching process technique, thereby forming a floating gate and control gate. Subsequently, the stacked gate structure is used as a mask to ion-implant an impurity into the semiconductor substrate, thereby forming impurity diffusion layers serving as a source region and drain region.

After that, an interlayer dielectric film is formed on the entire surface of the resultant semiconductor structure to planarize the surface.

Then, in those positions of the interlayer dielectric film which correspond to an interconnection layer, the control gate, the source region, and the drain region, contact holes corresponding to the individual depths are formed in accordance with the contact hole pattern formation method as described above. These contact holes correspond to the contact holes 11, 12, and 13 of the gate 101 having no fringe, the gate 102F having a fringe, and the impurity diffusion layer 103 shown in FIG. 1. These contact holes also correspond to contact holes 201 to 206 of the interconnections (the gates 211, 212, and 213 having no fringes and the gates 214F, 215F, and 216F having fringes) extended to connect the gates of transistors to the contacts shown in FIG. 2.

Subsequently, a metal is vapor-deposited on the interlayer dielectric film and in the contact holes, and patterned by anisotropic etching such as RIE to form interconnection layers.

After that, a passivation film is formed on the interlayer dielectric film and interconnection layers, and a NAND flash memory is completed through a wafer dicing step, a step of mounting a chip on a lead frame, a wire bonding step, a packaging step, and the like.

Second Embodiment

A pattern formation method according to the second embodiment of the present invention uses the bilayer resist process in the dual damascene process.

The damascene process is a method that forms a trench into the shape of an interconnection pattern, and forms the interconnection pattern by burying a material such as Cu in the trench. The dual damascene process is a process that forms not only an interconnection but also a contact hole (including a via hole) positioned in the interconnection at the same time by batch processing.

The pattern formation method using the bilayer resist process according to this embodiment will be explained below with reference to FIGS. 10 to 16.

First, as shown in FIG. 10, a silicon oxide film 70, a hard mask 71 made of, e.g., a silicon oxide film or amorphous silicon, and a first resist 72 are sequentially formed on the major surface of a semiconductor substrate 1.

Then, as shown in FIG. 11, a contact hole (including a via hole) 711 is formed by exposing and developing the first resist 72. The first resist 72 may also be made insoluble to the developer of a second resist 73.

Subsequently, the first resist 72 is coated with the second resist 73 as shown in FIG. 12, and an interconnection pattern is exposed and developed to form an interconnection pattern 713 and contact hole 711 as shown in FIG. 13.

After that, as shown in FIG. 14, etching is performed to transfer the contact hole 711 in the first resist 72 to a contact hole 712 in the hard mask 71, and the interconnection pattern 713 in the second resist 73 to an interconnection pattern 714 in the first resist 72.

Figure 15:
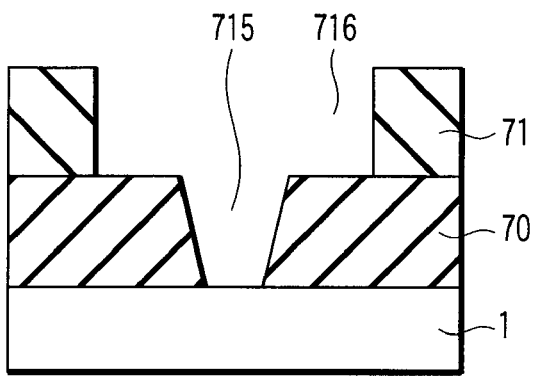
FIG. 15 is a sectional view showing a predetermined step following FIG. 14 of the pattern formation method.

When the etching further advances, as shown in FIG. 15, the contact hole 712 in the hard mask 71 transfers to a contact hole 715 in the oxide film 70, and the interconnection pattern 714 in the first resist 72 transfers to an interconnection pattern 716 in the hard mask 71.

Figure 16:
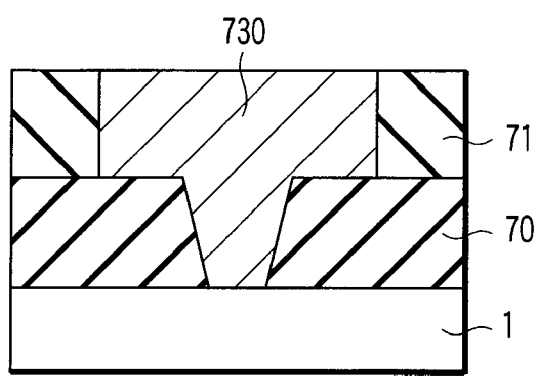
FIG. 16 is a sectional view showing a predetermined step following FIG. 15 of the pattern formation method.

Finally, as shown in FIG. 16, the dual damascene process of this embodiment is completed by burying an interconnection material 730 such as Cu in the contact hole 715 and interconnection pattern 716.

Figure 17:
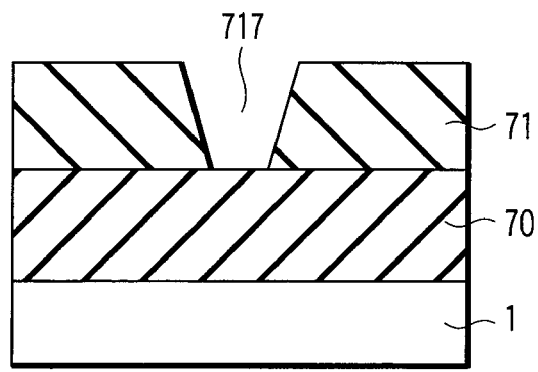
FIG. 17 is a sectional view showing a predetermined step following FIG. 11 of the conventional pattern formation method.

In the conventional general dual damascene process, a step of processing the contact hole 711 formed in the first resist 72 into a contact hole 717 in the hard mask 71 by etching as shown in FIG. 17 is inserted after the step shown in FIG. 11.

Figure 18:
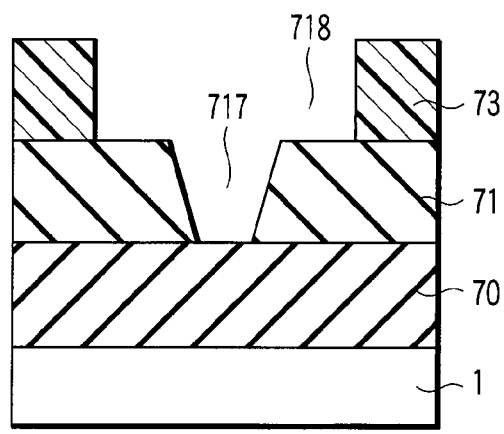
FIG. 18 is a sectional view showing a predetermined step following FIG. 17 of the conventional pattern formation method.
Figure 19:
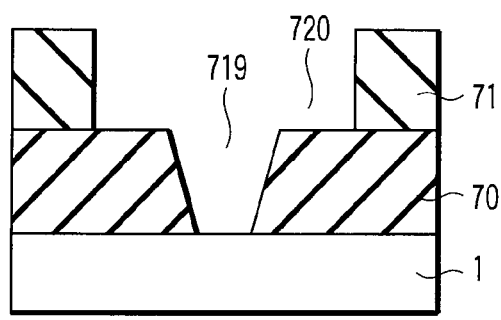
FIG. 19 is a sectional view showing a predetermined step following FIG. 18 of the conventional pattern formation method.

After that, as shown in FIG. 18, a second resist 73 is formed by coating, an interconnection pattern 718 is exposed and developed, and etching is performed again. In this manner, as shown in FIG. 19, the contact hole 717 and interconnection pattern 718 are processed into a contact hole 719 in the oxide film 70 and an interconnection pattern 720 in the hard mask 71.

Figure 20:
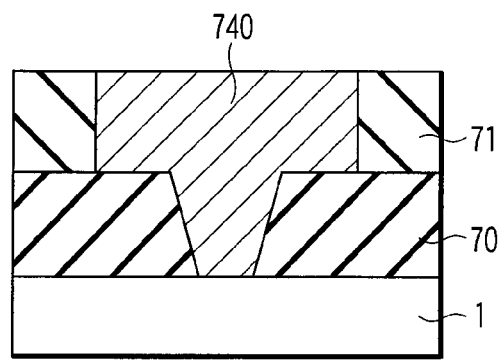
FIG. 20 is a sectional view showing a predetermined step following FIG. 19 of the conventional pattern formation method.

Finally, as shown in FIG. 20, the dual damascene process is completed by burying an interconnection material 740 such as Cu in the contact hole 719 and interconnection pattern 720.

In this embodiment using the bilayer resist process, the resist itself can be used as a mask material for forming an interconnection. This obviates the need for the step of processing the hard mask 71 shown in FIG. 17.

Interconnections are more and more increasing in number in particularly system LSI products. By applying the method disclosed in this embodiment to the processing of these products, therefore, the process cost can be greatly reduced compared to that of the conventional dual damascene process.

An outline of a semiconductor device fabrication method using the pattern formation method according to the second embodiment will be explained below by taking the fabrication steps of a memory cell portion in a NAND flash memory as an example.

First, as in the first embodiment, a stacked gate structure including a floating gate and control gate is formed by the well-known fabrication steps. Then, the stacked gate structure is used as a mask to ion-implant an impurity into a semiconductor substrate, thereby forming impurity diffusion layers serving as a source region and drain region. After that, an interlayer dielectric film is formed on the entire surface of the resultant semiconductor structure to planarize the surface.

Subsequently, in those positions of the interlayer dielectric film which correspond to an interconnection layer, the control gate, the source region, and the drain region, interconnection layers and contact holes are formed by the dual damascene process using the bilayer resist process described above.

After that, a passivation film is formed on the interlayer dielectric film and interconnection layers, and a NAND flash memory is completed through a wafer dicing step, a step of mounting a chip on a lead frame, a wire bonding step, a packaging step, and the like.

As described above, according to one aspect of the present invention, it is possible to provide a pattern formation method capable of improving the reliability of a device by forming the pattern of a contact hole connecting to a fine pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern formation method of forming a first hole and a second hole having different depths in an insulating layer formed on a semiconductor substrate, the method comprising:

forming a block film on a region which includes a region of the insulating layer where the first hole is to be formed, and in which the second hole is not to be formed;

forming a resist film having openings for forming the first hole and the second hole, on the block film and the insulating layer; and performing etching by using the resist film as a mask, thereby forming the first hole in the block film and the insulating layer, and the second hole in the insulating layer, a depth of the first hole from an upper surface of the insulating layer being smaller than that of the second hole such that the first hole does not reach the semiconductor substrate; and forming an antireflection coating on the block film and the insulating layer, wherein performing the etching using the resist film as a mask is terminated when a bottom surface of the second hole has reached an impurity diffusion layer formed in the semiconductor substrate, and wherein the resist film for forming the first hole and the second hole is formed on the antireflection coating.

2. A method according to claim 1, wherein when performing the etching is terminated, the first hole has reached an interconnection connected to a gate electrode of a transistor having the impurity diffusion layer as one of a source and a drain, a width of the interconnection in a horizontal direction to a major surface of the semiconductor substrate being smaller than a width of the first hole in the same direction.

3. A method according to claim 1, wherein the block film is made of a material which has an etching rate lower than that of the insulating layer.

4. A method according to claim 1, wherein the block film contains a resist material.

5. A method according to claim 1, wherein etching is performed using the resist film as a mask, thereby forming the first hole in the antireflection film, the block film, and the insulating layer, and the second hole in the antireflection film and the insulating layer.

6. A method according to claim 1, wherein the first hole and the second hole are respectively a first contact hole and a second contact hole.

7. A method according to claim 1, wherein the first hole and the second hole are respectively a first via hole and a second via hole.

8. A pattern formation method of forming a first hole and a second hole having different depths in an insulating layer formed on a semiconductor substrate, the method comprising:
  forming a block film on a region that includes a region of the insulating layer where the first hole is to be formed and in which the second hole is not to be formed;
  forming a resist film having openings for forming the first hole and the second hole, on the block film and the insulating layer;
  performing etching by using the resist film as a mask, thereby forming the first hole in the block film and the insulating layer, and the second hole in the insulating layer, a depth of the first hole from an upper surface of the insulating layer being smaller than that of the second hole such that the first hole does not reach the semiconductor substrate, and
  an insolubilizing process of making the block film insoluble to a developer of the resist film, after forming the block film and before forming the resist film.

9. A method according to claim 8, wherein the block film contains a resist material, and performing the insolubilizing process is to cure the resist material by irradiating the resist material with light.

\* \* \* \* \*